United States Patent
Moriguchi et al.

(10) Patent No.: US 7,256,109 B2
(45) Date of Patent: Aug. 14, 2007

(54) ISOTROPIC POLYCRYSTALLINE SILICON

(75) Inventors: Masao Moriguchi, Vancouver, WA (US); Apostolos T. Voutsas, Vancouver, WA (US); Mark A. Crowder, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 369 days.

(21) Appl. No.: 11/099,198

(22) Filed: Apr. 4, 2005

(65) Prior Publication Data
US 2005/0170568 A1    Aug. 4, 2005

Related U.S. Application Data

(62) Division of application No. 10/640,771, filed on Aug. 13, 2003, now Pat. No. 6,939,754.

(51) Int. Cl.
*H01L 21/20* (2006.01)
(52) U.S. Cl. .......... 438/486; 257/66; 257/75; 257/E33.003; 257/E29.292; 257/E21.133; 438/187; 438/482; 438/487

(58) Field of Classification Search ......... 257/66, 257/75, E33.003, E29.292, E21.133; 438/187, 438/482, 486, 487
See application file for complete search history.

(56) References Cited

U.S. PATENT DOCUMENTS

| | | | |
|---|---|---|---|
| 6,093,587 A * | 7/2000 | Ohtani | 438/166 |
| 6,337,233 B2 * | 1/2002 | Yang | 438/158 |
| 6,512,247 B1 * | 1/2003 | Suzuki et al. | 257/72 |
| 6,692,996 B2 * | 2/2004 | Lee et al. | 438/149 |
| 6,727,121 B2 * | 4/2004 | Joo et al. | 438/149 |
| 6,755,909 B2 * | 6/2004 | Jung | 117/4 |
| 7,132,375 B2 * | 11/2006 | Yamazaki | 438/795 |
| 7,138,658 B2 * | 11/2006 | Yamazaki et al. | 257/72 |

* cited by examiner

*Primary Examiner*—Asok Kumar Sarkar
(74) *Attorney, Agent, or Firm*—David C. Ripma

(57) ABSTRACT

A high-quality isotropic polycrystalline silicon (poly-Si) and a method for fabricating high quality isotropic poly-Si film are provided. The method includes forming a film of amorphous silicon (a-Si) and using a MISPC process to form poly-Si film in a first area of the a-Si film. The method then anneals a second area, included in the first area, using a Laser-Induced Lateral Growth (LILaC) process. In some aspects, a 2N-shot laser irradiation process is used as the LILaC process. In some aspects, a directional solidification process is used as the LILaC process. In response to using the MISPC film as a precursor film, the method forms low angle grain boundaries in poly-Si in the second area.

20 Claims, 9 Drawing Sheets

Fig. 2a
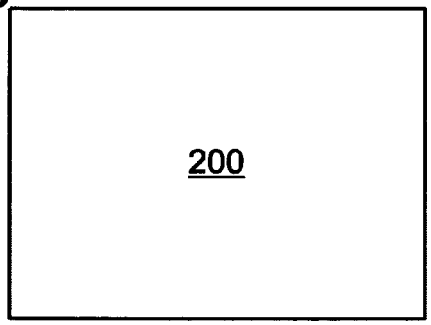
Fig. 2b 202 →
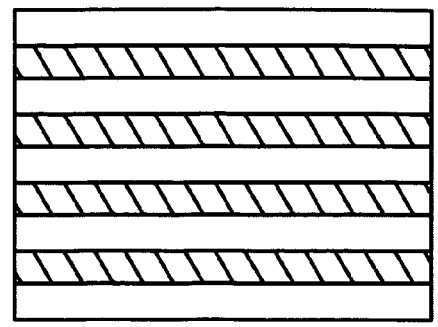
Fig. 2c
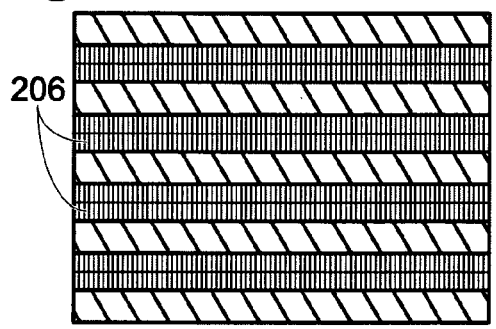
206  204
Fig. 2d
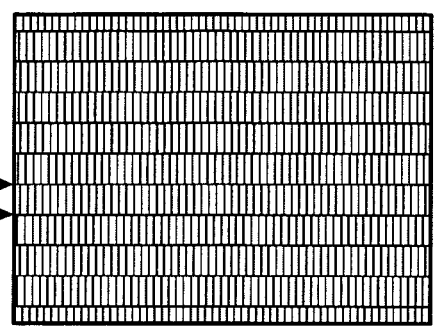
GRAIN BOUN- DARIES
Fig. 2e
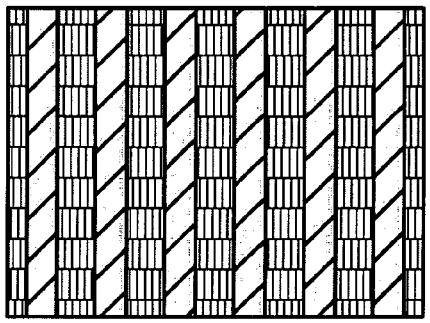
Fig. 2f
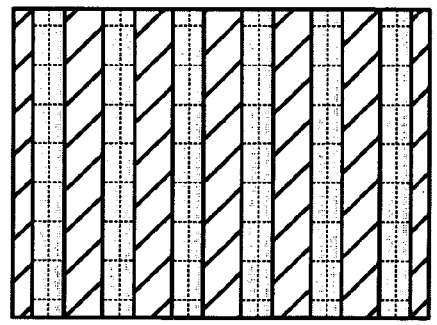
Fig. 2g
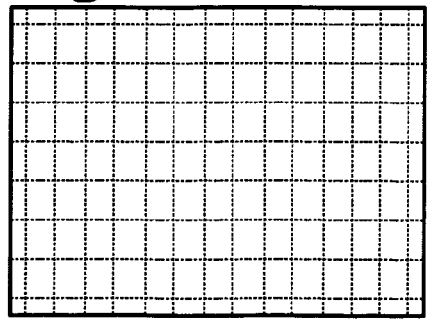

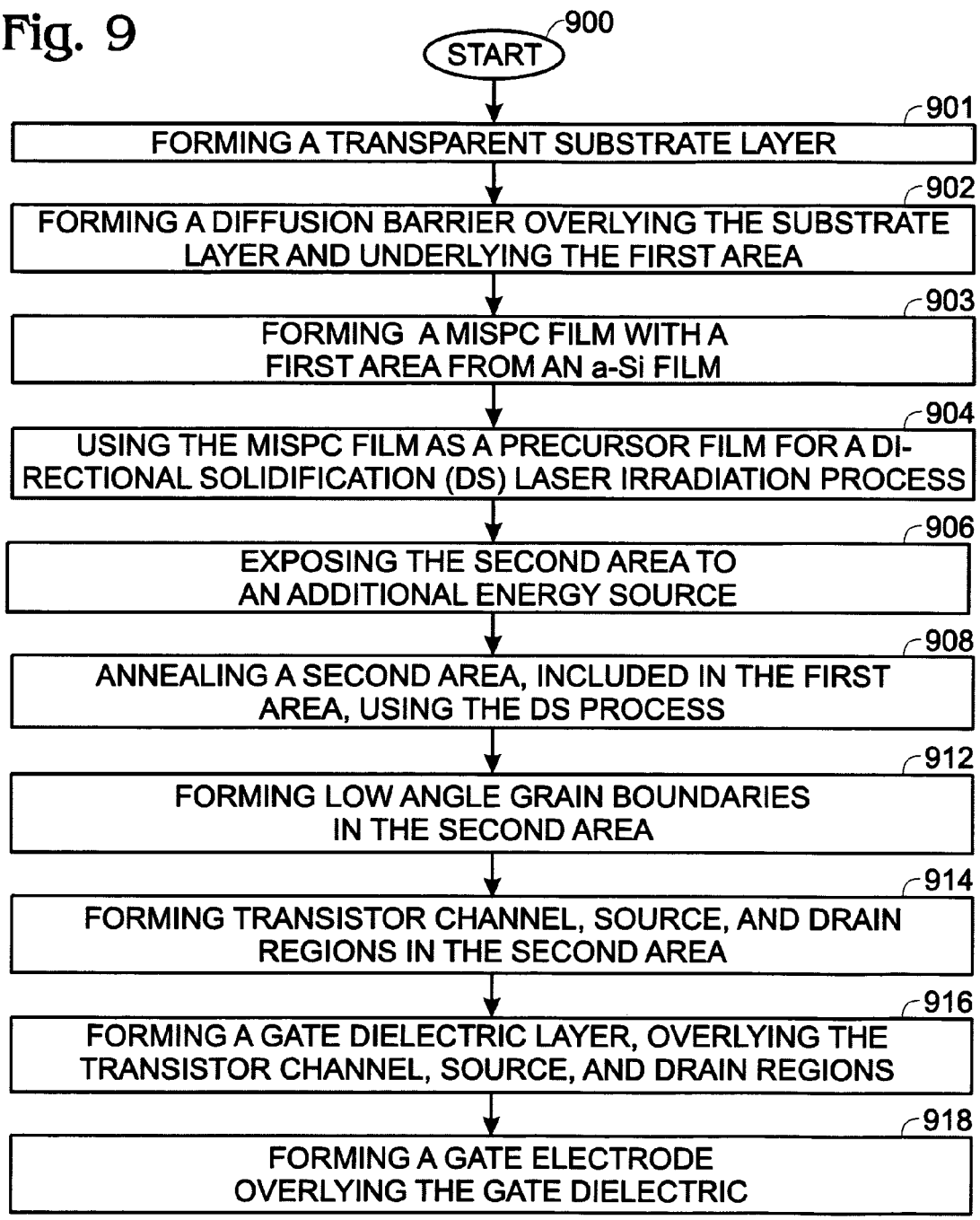

ISOTROPIC POLYCRYSTALLINE SILICON

RELATED APPLICATIONS

This application is a Divisional Application of a patent application entitled, ISOTROPIC POLYCRYSTALLINE SILICON AND METHOD FOR PRODUCING SAME, invented by Moriguchi et al., Ser. No. 10/640,771, filed Aug. 13, 2003 now U.S. Pat. No. 6,939,754.

BACKGROUND OF THE INVENTION

1. Field of the Invention

This invention generally relates to liquid crystal display (LCD) and integrated circuit (IC) fabrication, and more particularly, to a high-quality isotropic polycrystalline silicon (poly-Si) film and a corresponding laser irradiation fabrication process.

2. Description of the Related Art

When forming thin film transistors (TFTs) for use in LCD or other microelectronic circuits, the location of transistor channel regions, the orientation of regular structured poly-Si or single-grain-crystalline silicon, grain boundaries, and surface roughness are important issues. Such poly-Si material can be used as the active layer of poly-Si TFTs in the fabrication of active-matrix (AM) backplanes. These backplanes, in turn, can be used in the fabrication of AM LCDs and can be also combined with other display technologies, such as organic light-emitting diodes (OLEDs).

Poly-Si material is typically formed by the crystallization of an initially deposited amorphous Si (a-Si) films. This process can be accomplished via solid-phase-crystallization (SPC), i.e., by annealing a-Si films in a furnace at an appropriate temperature, for a sufficiently long time. Alternatively, laser annealing can also be used to achieve the phase transformation.

Conventionally, all crystallization techniques are applied to a given substrate in such a manner as to yield poly-Si film of a uniform quality throughout the substrate area. In other words, there is no spatial quality differentiation over the area of the substrate. For example, when a-Si film is annealed in a furnace or by rapid thermal-annealing, the entire layer is exposed to the same temperature, resulting in the same quality of poly-Si material. In the case of conventional laser annealing, some differentiation is possible, but the price, in terms of loss of throughput, is very high for the modest performance gains. Hence, even for conventional laser annealing, quality differentiation is not practically feasible.

It would be advantageous if a high throughput laser annealing process could produce high quality, isotropic polycrystalline silicon.

It would be advantageous if a high throughput laser annealing process could produce poly-Si with a higher percentage of lower-angle grain boundaries.

SUMMARY OF THE INVENTION

The present invention describes a high quality, isotropic polycrystalline silicon (poly-Si). The present invention also describes a process that yields a high quality, isotropic poly-Si. The present invention is accomplished using metal induced solid phase crystallization (MISPC) followed by a Laser-Induced Lateral Growth (LILaC) process. The present invention allows for the formation of integrated circuit (IC) devices, such as thin film transistors (TFTs), with enhanced performance characteristics due to the increase of lower-angle grain boundaries in poly-Si used for channel regions.

Accordingly, a method is provided for producing high quality isotropic poly-Si. The method includes forming a film of amorphous silicon (a-Si) and using a MISPC process to form poly-Si film in a first area of the a-Si film. The method then anneals a second area, within the first area, using a LILaC process. In some aspects, a LILaC 2N-shot laser irradiation process is used. In some aspects, a directional solidification process is used as the LILaC process. In response to using the MISPC film as a precursor film, the method forms low angle grain boundaries in poly-Si in the second area.

Additional details of the above-described method, and a high quality isotropic poly-Si film are presented in detail below.

BRIEF DESCRIPTION OF THE DRAWINGS

FIGS. 2a through 2g illustrate steps in a 2N-shot process, with N=2.

FIG. 5b is a plan view of poly-Si layer of FIG. 5a.

FIG. 9 is a flowchart further illustrating the method shown in FIG. 8.

DETAILED DESCRIPTION OF THE PREFERRED EMBODIMENTS

Laser-Induced Lateral Growth (LILaC) processes have significant flexibility in the fabrication of a wide variety of film microstructures. This technique relies on lateral growth of silicon grains using very narrow laser beams, which are generated by passing a laser beam through a beam-shaping mask and projecting the image of the mask to the film that is being annealed.

Figure 1:
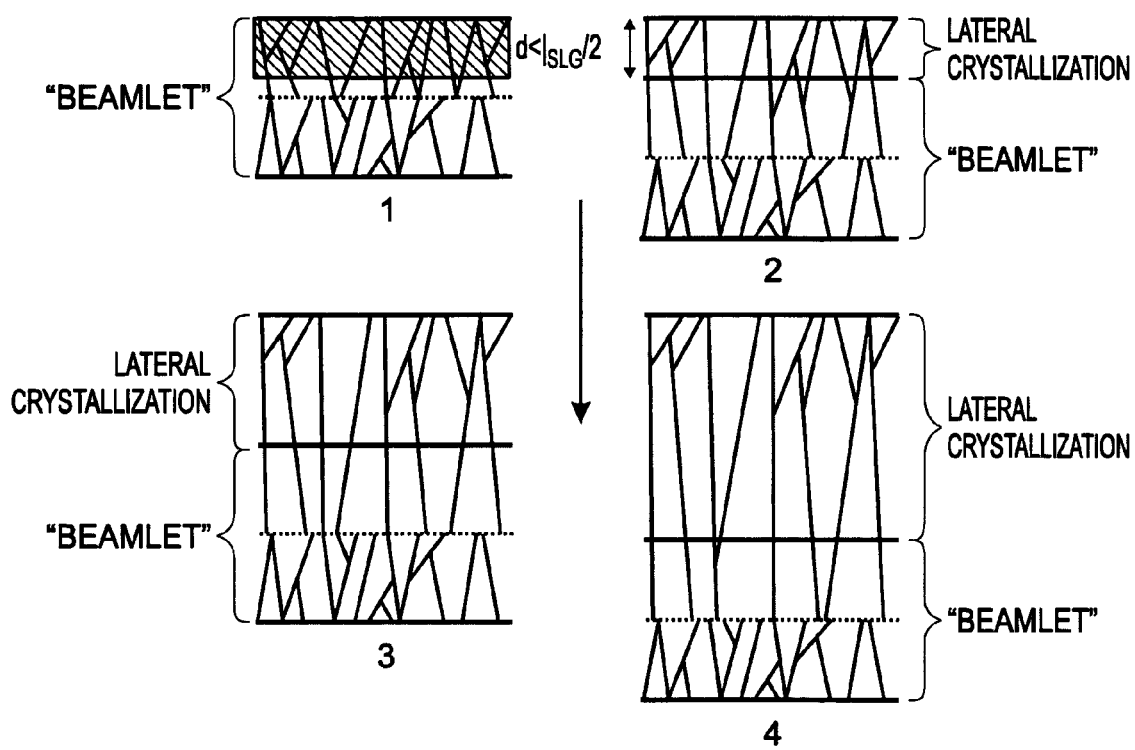
FIG. 1 illustrates the growth of long polycrystalline silicon (poly-Si) grains by a Directional Solidification (DS) process.

FIG. 1 illustrates the growth of long polycrystalline silicon (poly-Si) grains by a Directional Solidification (DS) process. One implementation of the LILaC process is DS. DS uses a step-and-repeat approach as shown in FIG. 1. The laser beamlet width (indicated by the 2 parallel, heavy black lines) irradiates the film and, then steps a distance (d), smaller than half of the lateral growth length (L), i.e. d<L/2. Using this step-and-repeat process, it is possible to continually grow crystal grains from the point of the initial irradiation, along the direction the beam is stepped, to the point where the irradiation steps cease. L is dependent upon a combination of film thickness and substrate temperature. For example, a typical value of L, for a 50 nanometer (nm)-thick film at room temperature, is approximately 1.2 microns (μm). The value of L is also dependent upon a slow beamlet advancement. At each step, grains are allowed to grow laterally from the crystal seeds of the poly-Si material formed in the previous step.

The above-described process is equivalent to laterally "pulling" the crystals, as in zone-melting-crystallization (ZMR) method or other similar processes. As a result, the crystal tends to attain very high quality along the "pulling" direction, in other words, the direction of the advancing beamlets (shown by the arrow in FIG. 1). This process occurs in a parallel fashion (from each slit on the mask). Once an area is crystallized, the substrate moves to a new (unannealed) location and the process is repeated.

At the first shot, the conjunction region of the lateral growth from the edge (center of the slit) forms grain boundaries. The electrical performance across these grain boundaries, as measured by electron mobility and threshold voltage (Vth), is poor. The surface is rough in these regions, because of the ridges that stem from volume differences between liquid and solid. However, successive steps in the DS method smooth the roughness caused by preceding steps. Unfortunately, the throughput of the DS method is relatively low since the scanning speed is typically limited to about 1 μm, to prolong lateral growth. In addition, the mobility in the channel regions of thin film transistors (TFTs) using poly-Si produced by the DS method is limited by sub-boundary spacing, which is typically in the range of 0.1 to 0.5 μm.

Figure 2H:
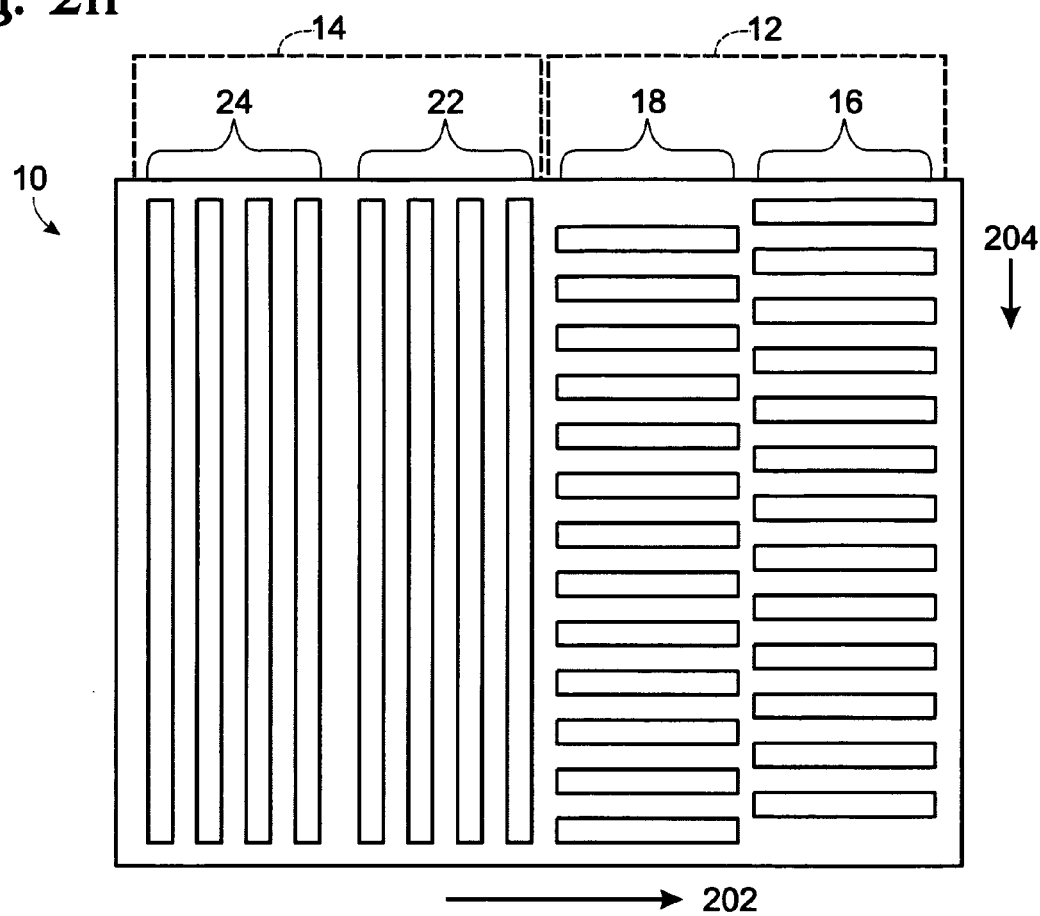
FIG. 2h illustrates an exemplary mask that could be used to enable the 2N-shot process.

FIGS. 2a through 2g illustrate steps in a 2N-shot process, with N=2, and FIG. 2h illustrates an exemplary mask that could be used to enable the 2N-shot process. The 2N-shot method uses beam-shaping mask designs and/or substrate scanning schemes. In the 2N-shot, or $2^N$-shot method, an amorphous silicon (a-Si) film is exposed to a set of laser irradiation steps with 'N' equal to the number of sets. The mask 10 of FIG. 2h includes a group (odd) of slits 12 arranged in a first direction 202 and a group (even) of slits 14 arranged in a second direction 204, orthogonal to the first direction 202. Slit sets 16 and 18 make up the first group 12. That is, N (the number of sets) equals 2. Likewise slit sets 22 and 24 make up group 14. The 2N-shot method can provide very high throughput, annealing a substrate dimension on the order of several hundred μm. The resulting poly-Si material has a square grid of grain boundaries. The 2N-shot method generally reduces defects in the Si material. However, within the grid, a certain percentage of defects remain.

More specifically, FIG. 2a shows an a-Si film 200, and FIG. 2b depicts the a-Si film being simultaneously irradiated with the first set of slits (16, see FIG. 2h), or shot, lengthwise in a first direction 202. FIG. 2c depicts simultaneous irradiation of the remaining a-Si regions with a second shot, as the beam progress to the second set of slits. The resulting crystal grains are laterally grown in a second direction 204, orthogonal to the advancing beam in first direction 202. Areas 206 are a poly-Si with a relatively large number of grains, or grain defects. The crosshatched regions in FIGS. 2b and 2c represent the areas being irradiated. FIG. 2d shows the results of a set of 2 shots in the first direction 202. The dark lines represent grain boundaries.

In FIG. 2e, a first shot of simultaneous irradiation is occurring in the cross-hatched regions lengthwise along the second direction 204, as the beam progresses with respect to the mask to the third set of slits (22, see FIG. 2h) orthogonal to the first and second set of slits (16/18). In FIG. 2f simultaneous irradiation is occurring in the cross hatched regions (the areas not irradiated in FIG. 2e), along the second direction 204, as the beam progresses to the fourth set of slits (24). FIG. 2g shows the results of the 2N-shot process, where N=2.

When the "N" is low (such as 1 or 2), considerable numbers of sub-grain boundaries remain in the resulting poly-Si material. As "N" increases, the poly-Si has increasingly fewer sub grain boundaries and within each "cell" of the square grid of grain boundaries, a square-shaped single crystal-like material forms. Unfortunately, increasing "N", to increase crystal quality (isotropy), reduces throughput, since process time also increases.

Figure 3A:
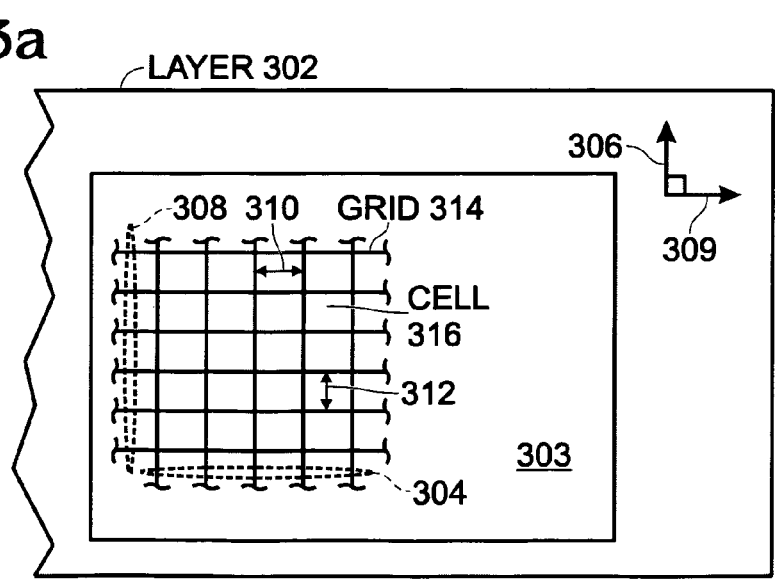
FIGS. 3a and 3b are plan views of the present invention high quality isotropic poly-Si film.
Figure 3B:
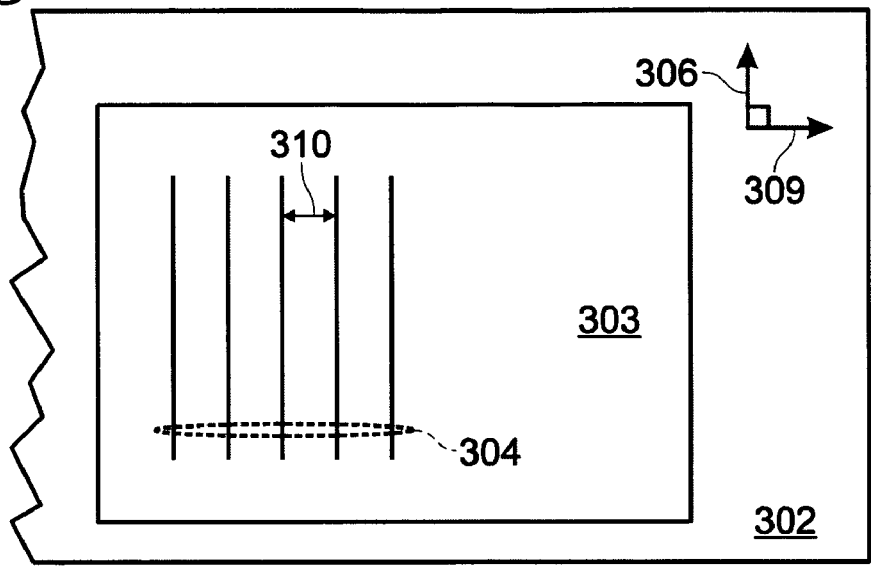

FIGS. 3a and 3b are plan views of the present invention high quality isotropic poly-Si film. In FIG. 3a, a poly-Si layer 302 includes a first low angle grain boundary region 303. The film 302 is formed by a metal induced solid phase crystallization (MISPC) process on a precursor film of a-Si. The film 302 is characterized by trace amounts metal atoms in a concentration of less than $1\ e^{17}$ ($1 \times 10^{17}$) atoms/square centimeter and approximately equiaxial, or disc-shaped, crystal domains having diameters in a range of 0.1 to 1 μm. The equiaxial regions are approximate in sense that their formation is subject to conventional process tolerances. Further, the invention is not dependent on equiaxial shapes, and other shapes are also possible. The metal atoms are incorporated, by implantation in some aspects, in a precursor a-Si film to initiate crystallization. Metals incorporated as part of a MISCP process include cobalt, copper, gold, iron, nickel, palladium, and platinum. The a-Si film is typically heated to 500-725° C. to initiate the crystallization.

A 2N-shot laser irradiation sequence is performed on the MISPC poly-Si in region 303. That is, the MISPC silicon is used as a precursor film for the 2N-shot process. The 2N-shot sequences create a high quality isotropic poly-Si film in region 303. The 2N-shot process performed upon region 303 results in a plurality 304 of parallel grain boundaries (GBs) oriented in a direction 306 and a plurality 308 of parallel GBs oriented in a direction 309. In general, the spacing 310 between consecutive GBs in plurality 304 is equal and the spacing 312 between consecutive GBs in plurality 308 is equal. However, other spacing configurations are possible. Pluralities 304 and 308 form a grid 314 of GBs. The grid 314, in turn, forms cells, such as cell 316.

Typically, the 2N-shot process results in the GBs 304 and 308 being orthogonally oriented as shown in FIG. 3. However, the boundaries need not necessarily be orthogonal. In FIG. 3a, N is greater than or equal to 2. Typically, for region 303, N is equal to 1 or 2. In general, the region 303 is rectangular, although it should be understood that other shapes are possible. It should be understood that the GBs 304 and 308 are not limited to any particular number, and need not necessary be equal in number.

The distances 310 and 312 can be controlled, within ranges discussed further below, by selecting parameters in the 2N-shot process, specifically, the width of laser beamlets (the width of the mask slits). The distances 310 and 312 are shown to be equal in FIG. 3a. That is, the cell 316 is square. However, it should be understood that the distances 310 and 312 need not necessarily be equal. In that case, the grid 316 is rectangular (not shown).

In general, the distances 310 and 312 are each in a range of 0.1 to 100 μm. The upper end of the range is dependent on the characteristics of the 2N-shot process, forming region 303. In general, the greater the distance 310 or 312, the higher the energy density required in the 2N-shot process. In some aspects, distances 310 and 312 are in a range of 5 to 50 μm. In some aspects, distances 310 and 312 are in a range of 10 to 30 μm. It should be understood that there is no requirement that the distances 310 and 312 be in a same range. For example, distance 310 could be in the range of 10 to 30 μm, and distance 312 could be in the range of 5 to 50 μm.

Figure 4A:
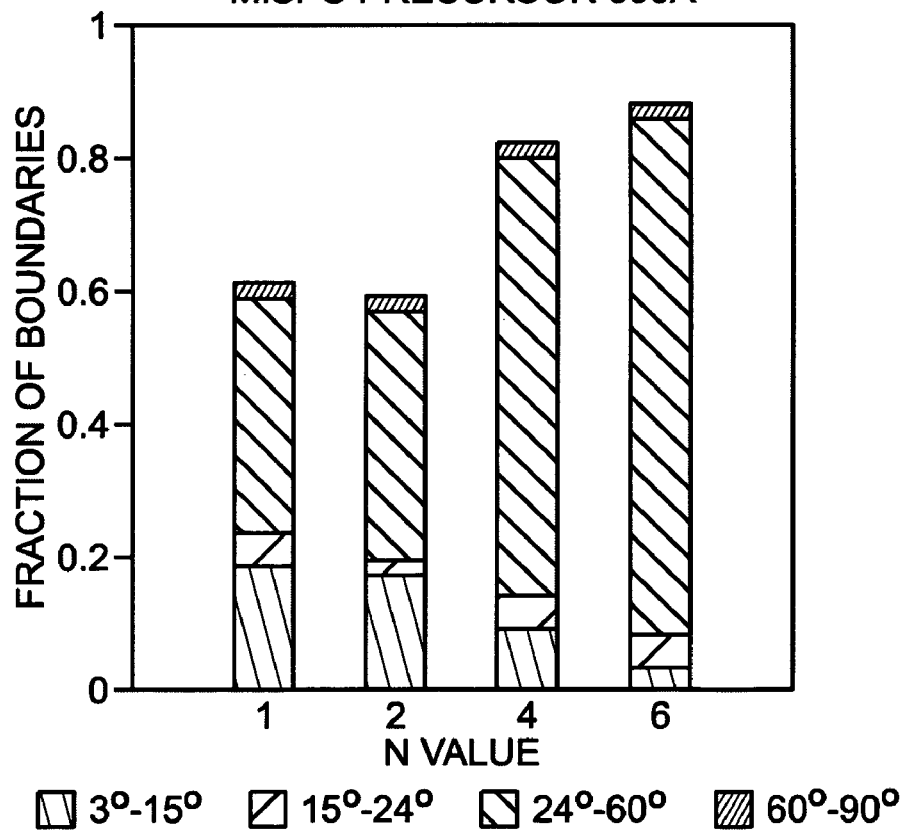
FIGS. 4a and 4b show, in a 2N-shot process, the correlation of grain boundary angular distribution to N value, film thickness, and type of silicon precursor film.
Figure 4B:
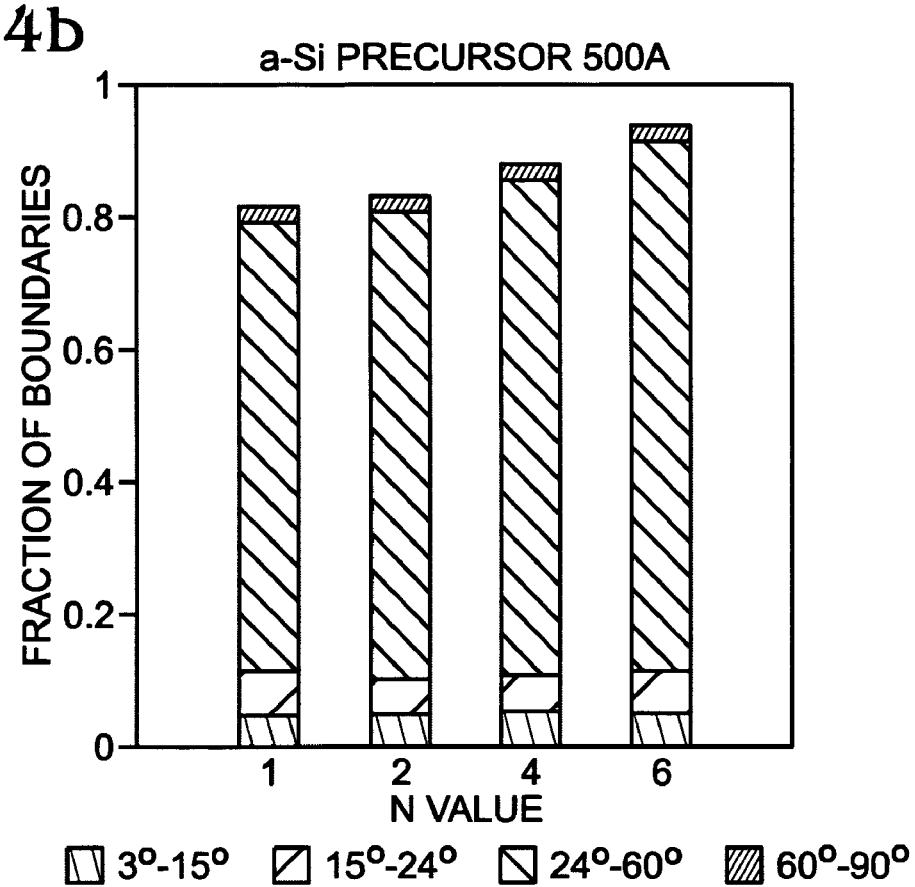

FIGS. 4*a* and 4*b* show, in a 2N-shot process, the correlation of grain boundary angular distribution to N value, film thickness, and type of silicon precursor film. For FIG. 4*a*, a film produced by a MISPC process is used as a precursor for the 2N-shot method. FIG. 4*a* is applicable to the present invention isotropic poly-Si film. For FIG. 4*b*, the precursor film is a-Si. FIGS. 4*a* and 4*b* only show grain boundaries having angles between 3 and 90 degrees. Grain boundaries with angles less than 3 degrees are interpreted as single-crystal silicon by the test equipment used to measure the grain boundaries. Therefore, grain boundaries with angles of less than 3 degrees are not detected by the test equipment. Hence, the percentages in each of the bar graphs in FIGS. 4*a* and 4*b* do not add up to 1. The "missing" percentages represent the grain boundaries with angles less than 3 degrees. For example, in FIG. 4*a*, with N=1, the bar graph shows a total of approximately 61 percent. The remaining 39 percent (not shown in the graph) is the grain boundaries with angles less than 3 degrees.

By using the MISPC silicon as a precursor film, the 2N-shot process forms a desirably higher percentage of low angle grain boundaries. As shown in FIG. 4*a*, for a 500 angstrom (A) precursor film with N equal to 1, the resulting poly-Si has approximately: 39 percent of grain boundaries less than 3 degrees; 19 percent of grain boundaries in a range of 3 to 15 degrees; and, 4 percent of grain boundaries in a range of 15 to 24 degrees. In general, increasing the percentage of low angle grain boundaries increases the quality of the poly-Si. When used in the channel region of a TFT, the increased percentage of low angle grain boundaries typically increases the carrier mobility. By contrast, as shown in FIG. 4*b*, using an a-Si precursor film with a thickness of 500 A and N=1 results in a poly-Si with higher angle grain boundaries. In FIG. 4*b*, the poly-Si has approximately: 39 percent of grain boundaries less than 3°; 19 percent of grain boundaries in a range of 3° to 15°; and 4 percent of grain boundaries in a range of 15° to 24°.

In FIG. 3*b*, the MISPC silicon region 302 has been subjected to a DS process. That is, the MISPC silicon is used as a precursor film for the DS process. The DS process creates a high quality isotropic polycrystalline silicon film in region 303. The film 303 is characterized by metal atoms in a concentration of less than 1 $e^{17}$ atoms/square centimeter, high aspect crystal domains separated by grain boundaries 304 configured in a first dimension, or direction 306, and having widths 310 in a range of 0.1 to 1 μm, and crystal defects spatially confined to the first dimension 306. Carrier conduction is nearly uninhibited in the first direction 306, but highly inhibited in a second direction 309 orthogonal to the first direction 306. By using the MISPC silicon as a precursor film, the DS process forms a larger percentage of low angle grain boundaries in region 303.

Figure 5A:
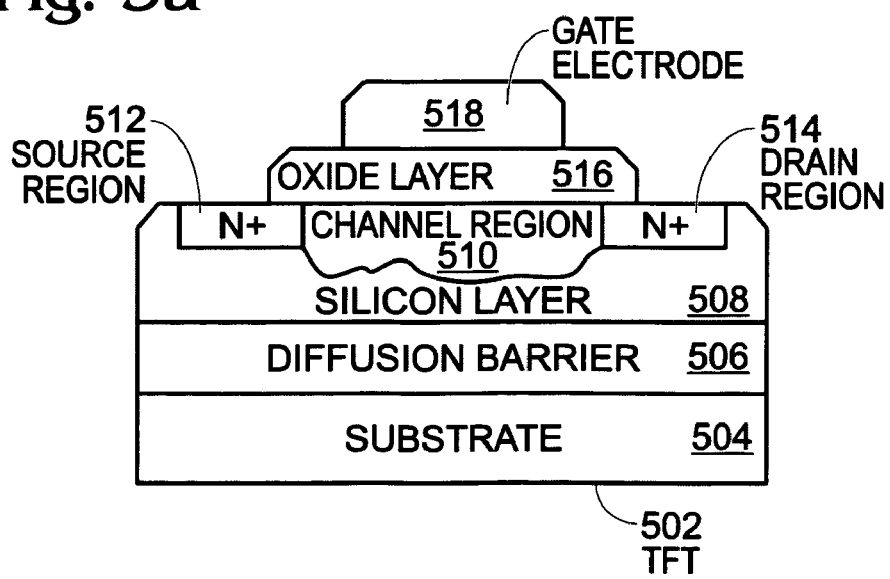
FIG. 5a is a partial cross-sectional view of a present invention TFT with a channel region formed from high quality isotropic poly-Si film.

FIG. 5*a* is a partial cross-sectional view of a present invention TFT with a channel region formed from high quality isotropic poly-Si film. It should be understood that the TFT of FIG. 5 is offered only as one illustration of the invention. A transparent substrate 504 is overlain by a diffusion barrier 506. A poly-Si layer 508 overlies the diffusion barrier 506. The silicon layer 508 could be the region 302 described in FIG. 3*a*, for example. The silicon layer 508 includes a channel region 510, a source region 512, and a drain region 514. An oxide gate insulator layer 516 overlies the silicon layer 508. A gate electrode 518 overlies the oxide gate insulator layer 516. The channel region 510 has a high percentage of low angle grain boundaries, enhancing the electrical performance of the channel 510, for example, increasing the carrier mobility in channel 510.

In some aspects, the channel region 510 includes grain boundaries from the 2N-shot grid (reference designator 314, see FIG. 3*a*) and the thickness of the gate insulator layer 516 is less than 1000 A In some aspects, the channel region 510 does not include grain boundaries from the 2N-shot grid. Therefore, the surface (not shown) of the region 510 is very smooth and the thickness of the gate insulator layer 516 can be relatively thin, in a range of 20 to 500 A. Minimizing gate insulator layer thickness permits reductions in device geometry, for example, a reduction in the overall size of TFT 502.

In some aspects, the region 510 is formed by a single 2N-shot sequence (N is equal to 1). Therefore, as shown in FIG. 4*a*, region 510 has approximately: 39 percent of grain boundaries less than 3°; 19 percent of grain boundaries in a range of 3° to 15°; and 4 percent of grain boundaries in a range of 15° to 24°. Grain boundary percentages in region 510 for aspects in which N=2, N=4, or N=6 are shown in FIG. 4*a*.

Figure 5B:
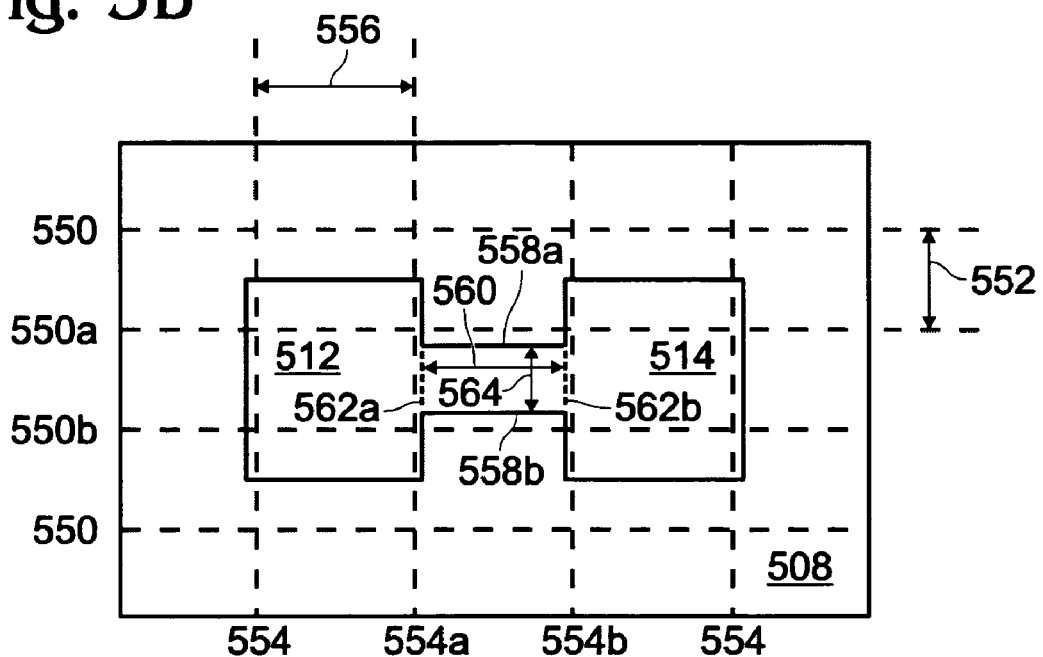

FIG. 5*b* is a plan view of poly-Si layer 508 of FIG. 5*a*. Shown are a first plurality grain boundaries 550 are separated by a first distance 552 in a range of 0.1 to 100 μm, and a second plurality grain boundaries 554 are separated by a second distance 556 in a range of 0.1 to 100 μm. In some aspects, the first distance 552 is in a range of 5 to 50 μm and the second distance 556 is in a range of 5 to 50 μm. In other aspects, the first and second distances is in a range of 10 to 30 μm.

In some aspects, the channel region 510 has a first pair of sides 558*a* and 558*b* forming a length 560. The first pair of sides 558*a*/558*b* are parallel to, and located between a first pair of grain boundaries 550*a* and 550*b*. Likewise, a second pair of sides 562*a* and 562*b* form a width 564. The second pair of sides 562*a*/562*b* are parallel to, and located between a second pair of grain boundaries 554*a* and 554*b*.

In some aspects, at least one side, side 558*a* for example, is co-located on a grain boundary, grain boundary 550*a* for example. Likewise, at least one side in the second pair of sides, side 562*a* for example, can be co-located on a grain boundary, boundary 554*a* for example. As shown, the first pair of sides 558*a*/558*b* is located between a first pair of consecutive grain boundaries.

Figure 6:
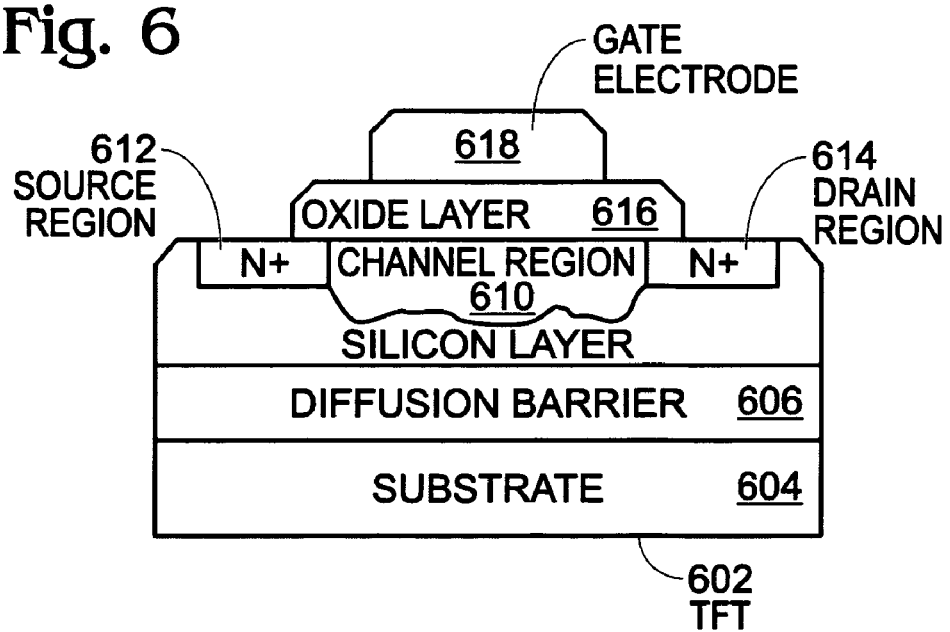
FIG. 6 is a partial cross-sectional view of a present invention TFT with a channel region formed from high quality isotropic poly-Si film.

FIG. 6 is a partial cross-sectional view of a present invention TFT with a channel region formed from high quality isotropic poly-Si film. It should be understood that the TFT of FIG. 6 is offered only as one illustration of the invention. In the TFT 602, a transparent substrate 604 is overlain by a diffusion barrier 606. A poly-Si layer 608 overlies the diffusion barrier 606. The silicon layer 608 is formed by a DS process, see the description of region 303 of FIG. 3. The silicon layer 608 includes a channel region 610, a source region 612, and a drain region 614. An oxide gate insulator layer 616 overlies the silicon layer 608 and a gate electrode 618 overlies the oxide gate insulator layer 616. Because the surface (not shown) of the region 610 is smooth, the thickness of the gate insulator layer 616 can be reduced to a range of 20 to 500 A. Minimizing gate insulator layer thickness permits reductions in device geometry, for example, a reduction in the size of TFT 602. The channel region 610 has a high percentage of low angle grain boundaries, enhancing the performance of the region 610, for example, increasing the carrier mobility of TFT 602.

FUNCTIONAL DESCRIPTION

The present invention describes a high quality isotropic polycrystalline silicon (poly-Si) interface, and a method for producing high quality isotropic poly-Si using a combination of metal induced solid phase crystallization (MISPC) and Laser-Induced Lateral Growth (LILaC) processes. The MISPC process is used for a first crystallization of an amorphous silicon (a-Si) film and the LILaC processes are used for the second crystallization of the resulting poly-Si film. The above-described 2N-shot and directional solidification (DS) processes are both examples of LILaC. Each LILaC process uses different beam-shaping mask designs and substrate scanning scheme, as the substrate moves under the mask.

Figure 7:
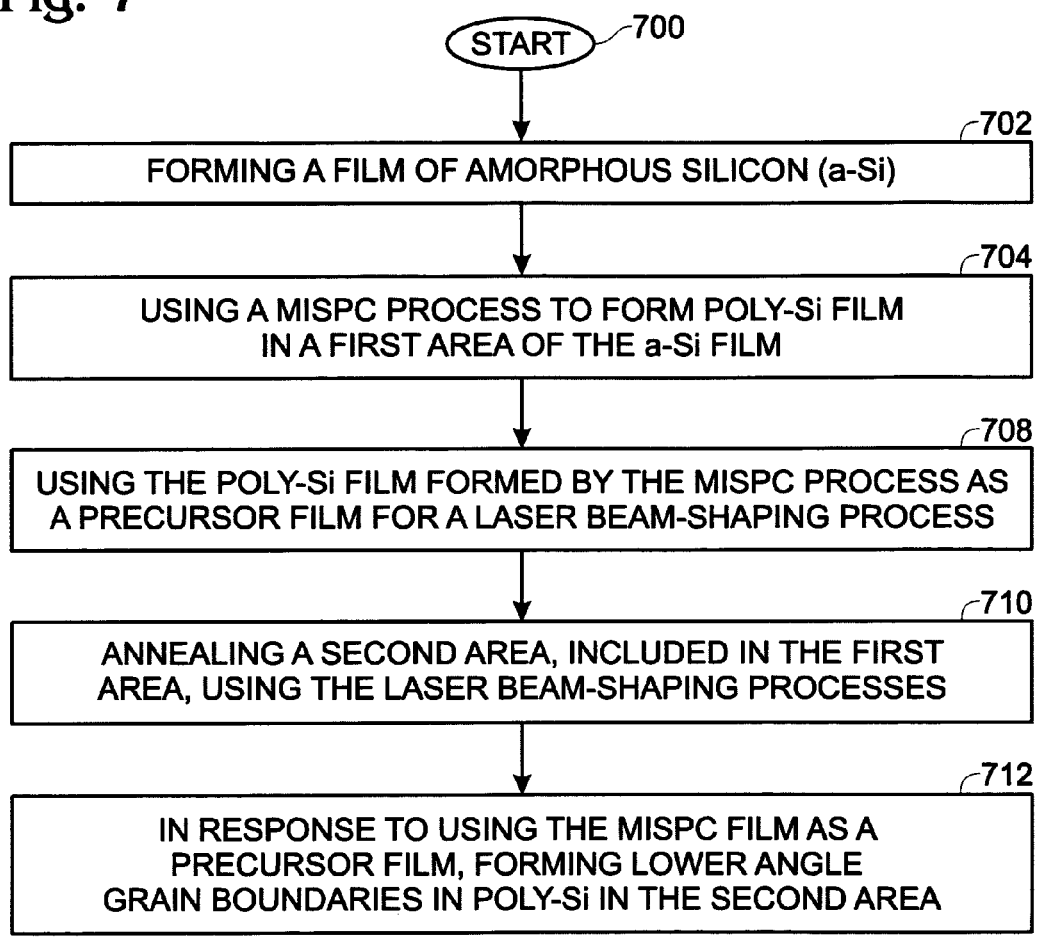
FIG. 7 is a flowchart illustrating a present invention method for producing high quality isotropic poly-Si.

FIG. 7 is a flowchart illustrating a present invention method for producing high quality isotropic poly-Si. Although the method in FIG. 7 (and FIGS. 8 and 9 below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts with Step 700. Step 702 forms a film of a-Si. Step 704 uses a MISPC process to form poly-Si film in a first area of the a-Si film. In some aspects, Step 704 overlies a first area top surface with a nucleating site forming material and heats the silicon and nucleating films. Step 708 uses the poly-Si film formed by the MISPC process as a precursor film for a laser beam-shaping process. Step 710 anneals a second area, included in the first area, using the laser beam-shaping process. Step 712, in response to using the MISPC film as a precursor film, forms low angle grain boundaries in poly-Si in the second area.

In some aspects, overlying a first area top surface with a nucleating site forming material in Step 704 includes overlying the top surface with a nucleating site forming material such as cobalt, copper, gold, iron, nickel, palladium, or platinum, and having a thickness in a range of 10 to 80 angstroms (A). In some aspects, heating the silicon and nucleating films in Step 706 includes heating the amorphous silicon film and the film of nucleating site forming material to a temperature in a range of 500 to 725° C.

Figure 8:
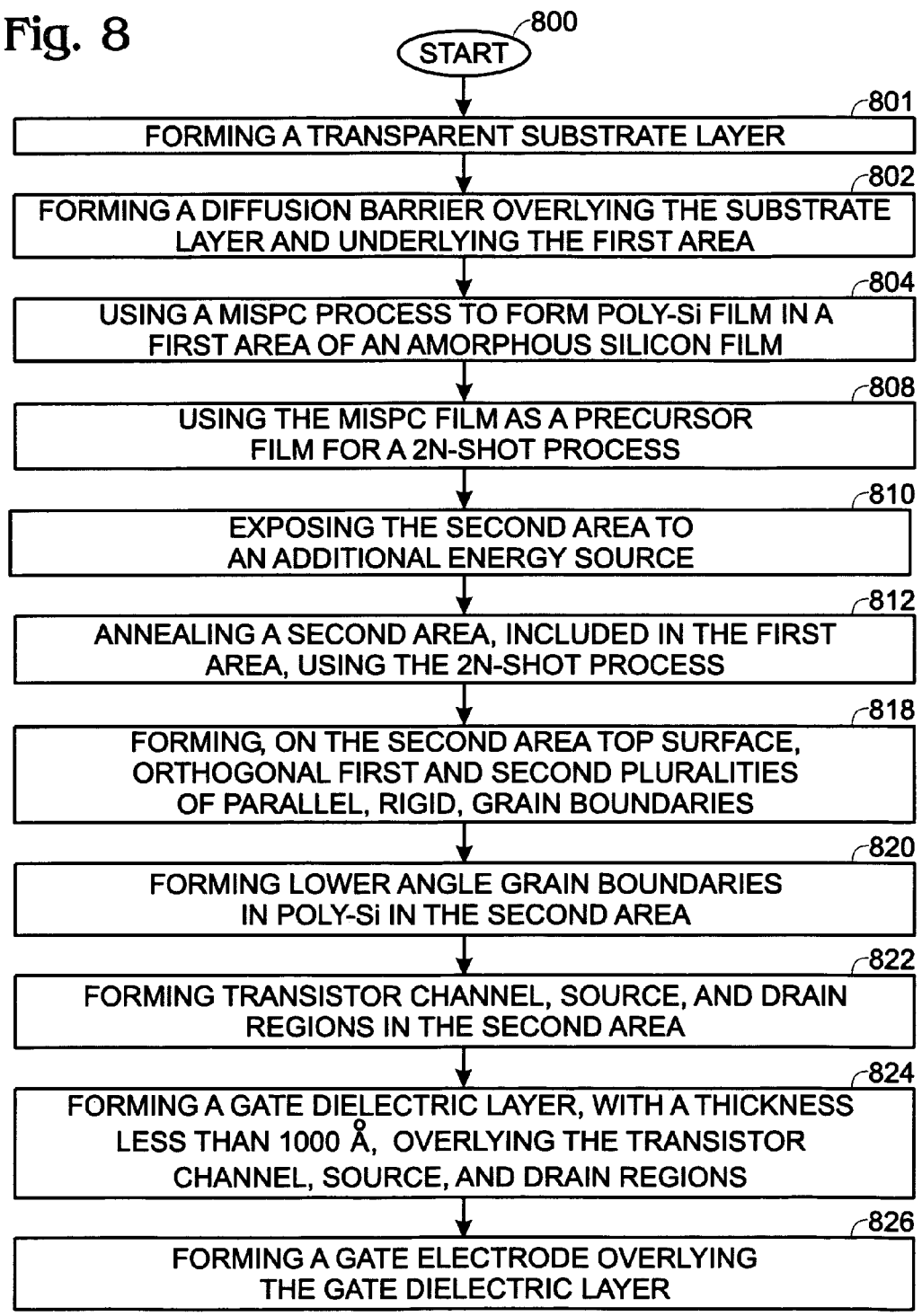
FIG. 8 is a flowchart further illustrating the method shown in FIG. 7.

FIG. 8 is a flowchart further illustrating the method shown in FIG. 7. The method starts at Step 800. Step 804 uses a MISPC process to form poly-Si film in a first area of the a-Si film. In some aspects, Step 804 overlies a first area top surface with a nucleating site forming material and heats the silicon and nucleating films. Step 808 uses the MISPC film as a precursor film for a 2N-shot laser irradiation process. Step 812 anneals a second area, included in the first area, using the 2N-shot process. In some aspects, a mask, such as the mask depicted in FIG. 2h, is used to enable the 2N-shot annealing. In some aspects, Step 812 sequences irradiation in odd and even iteration patterns. That is, sequentially irradiating in odd and even iteration patterns, the patterns including: for odd numbered iterations, projecting a first laser beam, in two steps, through a first aperture pattern oriented in a first direction; and, for even numbered iterations, projecting the first laser beam, in two steps, through a second aperture pattern oriented in a second direction orthogonal to the first direction.

In other aspects, Step 812 selects first and second aperture patterns; projects a first laser beam, in two steps per iteration, through the first and second aperture patterns; and anneals the second area. Step 812 also forms, on the second area top surface, orthogonal first and second pluralities of parallel, ridged, grain boundaries. That is, annealing the second area using a 2N-shot process includes forming in the second area: a first plurality of parallel grain boundaries oriented in the first direction and having consecutive grain boundaries equally spaced by a first width; and, a second plurality of parallel grain boundaries oriented in the second direction and having consecutive grain boundaries equally spaced by a second width. Step 820 forms low angle grain boundaries in poly-Si in the second area.

In some aspects, overlying a first area top surface with a nucleating site forming material in Step 804 includes overlying, on the first area top surface, a plurality of parallel strips of material, oriented in the first direction and having a selected length, a selected width, and a selected spacing. Then, using a MISPC process to form poly-Si film in Step 804 includes laterally growing silicon crystals in the first area, the growth originating from areas overlain by the plurality of strips and oriented in the second direction. In some aspects, overlying a plurality of strips includes overlying a plurality of strips with equal widths.

In some aspects, forming low angle grain boundaries in poly Si in the second area in Step 820 includes forming poly-Si with approximately: 39 percent of grain boundaries less than 3°; 19 percent of grain boundaries in a range of 3° to 15°; and 4 percent of grain boundaries in a range of 15° to 24°.

In some aspects, sequencing irradiation in odd and even iteration patterns in Step 812 includes performing one odd iteration and one even iteration. In some aspects, annealing the second area using the 2N-shot process includes performing only a single iteration.

In some aspects, projecting a first laser beam through first and second aperture patterns in Step 812 includes projecting onto the second area top surface orthogonal first and second pluralities of rectangular first laser beamlets. In some aspects, projecting first laser beamlets includes projecting beamlets with equal widths. In some aspects, projecting first laser beamlets includes selecting beamlet widths in a range of 0.1 to 100 µm. In some aspects, selecting beamlet widths in a range of 0.1 to 100 µm includes selecting the first and second widths in a range of 5 to 50 µm. In some aspects, selecting beamlet widths in a range of 5 to 50 µm includes selecting the first and second widths in a range of 10 to 30 µm.

In some aspects, projecting a first laser beam through first and second aperture patterns in Step 812 includes projecting a first laser beam with a wavelength less than 550 nm. In some aspects, projecting a first laser beam through first and second aperture patterns in Step 812 includes projecting a first laser beam with a wavelength between 248 and 308 nm. In some aspects, projecting a first laser beam through first and second aperture patterns in Step 812 includes using a first excimer laser source to supply the first laser beam. In some aspects, projecting a first laser beam through first and second aperture patterns in Step 812 includes projecting the first laser beam for a pulse duration of up to 300 ns. In some aspects, projecting the first laser beam for a pulse duration of up to 300 ns includes projecting the first laser beam for a pulse duration of up to 30 ns. In some aspects, projecting a first laser beam through first and second aperture patterns in Step 812 includes projecting the first laser beam by a factor of one.

In some aspects, a Step 810 exposes the second area to an additional energy source. Then, annealing the second area in Step 812 includes summing energy densities from the first laser and the additional energy source to anneal the second area. In some aspects, exposing the second area to an additional energy source in Step 810 includes projecting a third laser beam. In some aspects, projecting a third laser beam includes projecting, from a solid state laser source, a third laser beam with a wavelength of 532 nanometers (nm) and a pulse duration of between 50 and 150 nanoseconds (ns). In some aspects, projecting a third laser beam includes projecting, from a carbon dioxide ($CO_2$) laser source, a third laser beam with a wavelength in a range of 10.2 to 10.8 μm and a pulse duration of up to 4 milliseconds (ms).

In some aspects, exposing the second area to an additional energy source in Step 810 includes exposing the second area to a first lamp light. In some aspects, exposing the second area to a first lamp light includes exposing the first area to a lamp light with a wavelength less than 550 nm. In some aspects, exposing the first area to a first lamp light includes using a first excimer lamp to supply the light. In some aspects, exposing the first area to a first lamp light includes exposing a first bottom surface of the amorphous silicon film including the second area. In some aspects, exposing the second area to a first lamp light includes exposing a first top surface of the amorphous silicon film including the second area.

The following describes one possible sequence for forming a TFT using the present invention method illustrated in FIG. 8. In some aspects of the method, Step 801 forms a transparent substrate layer. Then, Step 802 forms a diffusion barrier overlying the substrate layer and underlying the first area. In some aspects, a Step 822, following the forming of low angle grain boundaries in Step 820, forms transistor channel, source, and drain regions in the second area. Then, Step 824 forms a gate dielectric layer, with a thickness less than 1000 Å, overlying the transistor channel, source, and drain regions and Step 826 forms a gate electrode overlying the gate dielectric layer.

In some aspects, forming a transistor channel region in the second area in Step 822 includes forming a channel length with a first pair of sides parallel to and located between a first pair of grain boundaries and forming a channel width with a second pair of sides parallel to and located between a second pair of grain boundaries.

In some aspects, forming a transistor channel region in the second area in Step 822 includes forming a channel length with a first pair of sides parallel to and located between a first pair of consecutive grain boundaries. Then, forming a gate dielectric layer in Step 824 includes forming a layer with a thickness in a range of 20 to 500 Å.

FIG. 9 is a flowchart further illustrating the method shown in FIG. 7. The method starts at Step 900. Step 903 forms a MISPC film with a first area from an a-Si film. Step 904 uses the MISPC film as a precursor film for a directional solidification (DS) laser irradiation process. Step 908 anneals a second area, included in the first area, using the DS process.

In some aspects, Step 908 projects a second laser through a third aperture pattern to sequentially anneal the second area. That is, annealing the second area using a DS process includes: selecting a third aperture pattern; orienting the third aperture pattern and a second area top surface in a first direction; projecting a second laser beam through the third aperture pattern to anneal a first portion of the second area; and, sequentially: advancing the third aperture pattern and the top surface in the first direction; projecting the second laser beam through the third aperture pattern; and, annealing remaining portions of the second area. Step 912 forms low angle grain boundaries in poly-Si in the second area. In some aspects, projecting a second laser through a third aperture pattern to sequentially anneal the second area in Step 908 includes projecting a second laser beam with a wavelength less than 550 nm. In some aspects, projecting a second laser through a third aperture pattern to sequentially anneal the second area in Step 908 includes projecting a second laser beam with a wavelength between 248 and 308 nm. In some aspects, projecting a second laser through a third aperture pattern to sequentially anneal the second area in Step 908 includes using a second excimer laser source to supply the second laser beam. In some aspects, projecting a laser through a third aperture pattern to sequentially anneal the second area in Step 908 includes projecting the second laser beam for a pulse duration of up to 300 ns. In some aspects, projecting the second laser beam for a pulse duration of up to 300 ns includes projecting the second laser beam for a pulse duration of up to 30 ns. In some aspects, projecting a second laser through a third aperture pattern to sequentially anneal the second area in Step 908 includes projecting the second laser beam by a factor of one.

In some aspects, a Step 906 exposes the second area to an additional energy source. Then, annealing the second area in Step 908 includes summing energy densities from the second laser and the additional energy source to anneal the second area. In some aspects, exposing the second area to an additional energy source in Step 906 includes projecting a fourth laser beam onto the second area; and, exposing the second area to an eighth energy density from the fourth laser beam. Then, annealing the second area (Step 908) includes: summing the seventh and eighth energy densities to yield a ninth energy density; and, annealing the second area in response to the ninth energy density.

In some aspects, projecting a fourth laser beam includes projecting, from a solid state laser source, a fourth laser beam with a wavelength of 532 nm and a pulse duration of between 50 and 150 ns. In some aspects, projecting a fourth laser beam includes projecting, from a carbon dioxide ($CO_2$) laser source, a fourth laser beam with a wavelength in a range of 10.2 μm to 10.8 μm and a pulse duration of up to 4 ms.

In some aspects, exposing the second area to an additional energy source in Step 906 includes exposing the second area to a second lamp light having an eleventh energy density. Then, projecting a second laser beam through the third aperture pattern to anneal the second area (Step 908) includes exposing the second area to a tenth energy density from the second laser beam; summing the tenth and eleventh energy densities to yield a twelfth energy density; and, annealing the second area in response to the twelfth energy density.

In some aspects, exposing the second area to a second lamp light includes exposing the second area to a lamp light with a wavelength less than 550 nm. In some aspects, exposing the second area to a second lamp light includes using a second excimer lamp to supply the light. In some aspects, exposing the second area to a second lamp light includes exposing a bottom surface of the amorphous silicon film including the second area. In some aspects, exposing the second area to a second lamp light includes exposing a top surface of the amorphous silicon film including the second area.

The following describes one possible sequence for forming a TFT using the present invention method illustrated in FIG. 9. In some aspects of the method, Step 901 forms a transparent substrate layer. Then, Step 902 forms a diffusion barrier overlying the substrate layer and underlying the first area. In some aspects, Step 914, following the forming of low angle grain boundaries in poly-Si in the second area in Step 912, forms transistor channel, source, and drain regions in the second area. Then, Step 916 forms a gate dielectric layer, with a thickness in a range of 20 to 500 A, overlying the transistor channel, source, and drain regions and Step 918 forms a gate electrode overlying the gate dielectric layer.

A high quality isotropic poly-Si film and method for producing high quality isotropic poly-Si have been provided. Examples have been provided of some material configurations, such as a TFT. Likewise, some process specifics have been given to clearly explain the fundamental concepts. However, the present invention is not limited to just those thickness, configurations, and specifics. Other variations and embodiments of the present invention will occur to those skilled in the art.

We claim:

1. A high quality isotropic polycrystalline silicon film, the film comprising:
    a metal induced solid phase crystallization (MISPC) polycrystalline region with:
        metal atoms in a concentration of less than 1 $e^{17}$ atoms/square centimeter; and,
        approximately equiaxial crystal domains having diameters in a range of 0.1 to 1 micron (μm); and,
    in the MISPC region, a low angle grain boundary region having a first plurality of parallel grain boundaries and, orthogonal to the first plurality, a second plurality of parallel grain boundaries.

2. The film of claim 1 wherein the first plurality grain boundaries are separated by a first distance in a range of greater than 0.1 to 100 μm; and,
    wherein the second plurality grain boundaries are separated by a second distance in a range of greater than 0.1 to 100 μm.

3. The film of claim 2 wherein the first distance is in a range of 5 to 2 μm; and,
    wherein the second distance is in a range of 5 to 2 μm.

4. The film of claim 3 wherein the first distance is in a range of 10 to 30 μm; and,
    wherein the second distance is in a range of 10 to 30 μm.

5. The film of claim 2 wherein the low angle grain boundary region has approximately: 39 percent of grain boundaries less than 3°; 19 percent of grain boundaries in a range of 3° to 15°; and 4 percent of grain boundaries in a range of 15° to 24°.

6. The film of claim 1 wherein the metal atoms are selected from the group including cobalt, copper, gold, iron, nickel, palladium, and platinum atoms.

7. A high quality isotropic polycrystalline silicon film, the film comprising:
    a metal induced solid phase crystallization (MISPC) polycrystalline region with:
        metal atoms in a concentration of less than 1 $e^{17}$ atoms/square centimeter; and,
        approximately equiaxial crystal domains having diameters in a range of 0.1 to 1 micron (μm); and,
    in the MISPC region, a directional solidification polycrystalline region with:
        high aspect ratio crystal domains separated by parallel grain boundaries configured in a first dimension and having widths in a range of 0.1 to 1 μm; and,
        crystal defects spatially confined to the first dimension.

8. The film of claim 7 wherein the metal atoms are selected from the group including cobalt, copper, gold, iron, nickel, palladium, and platinum atoms.

9. A thin film transistor (TFT) with a channel region formed from high quality isotropic polycrystalline silicon (poly-Si), the TFT comprising:
    a transparent substrate;
    a diffusion barrier overlying the transparent substrate;
    overlying the diffusion barrier, a high quality isotropic poly-Si layer with:
        metal atoms in a concentration of less than 1 $e^{17}$ atoms/square centimeter;
        approximately equiaxial crystal domains having diameters in a range of 0.1 to 1 micron (μm);
        a first plurality of parallel grain boundaries and, orthogonal to the first plurality, a second plurality of parallel grain boundaries;
        transistor source and drain regions; and,
        a transistor channel region interposed between the source and drain regions;
    an oxide gate insulator layer with a thickness of less than 1000 angstroms (A) overlying the poly-Si layer; and,
    a gate electrode overlying the oxide gate insulator layer.

10. The TFT of claim 9 wherein the first plurality grain boundaries are separated by a first distance in a range of 0.1 to 100 μm; and,
    wherein the second plurality grain boundaries are separated by a second distance in a range of 0.1 to 100 μm.

11. The TFT of claim 10 wherein the first distance is in a range of 5 to 50 μm; and,
    wherein the second distance is in a range of 5 to 50 μm.

12. The TFT of claim 11 wherein the first distance is in a range of 10 to 30 μm; and,
    wherein the second distance is in a range of 10 to 30 μm.

13. The TFT of claim 10 wherein the channel region has:
    a first pair of sides forming a length, the first pair of sides parallel to and located between a first pair of grain boundaries; and,
    a second pair of sides forming a width, the second pair of sides parallel to and located between a second pair of grain boundaries.

14. The TFT of claim 13 wherein at least one side in the first pair of sides is co-located on a grain boundary.

15. The TFT of claim 13 wherein at least one side in the second pair of sides is co-located on a grain boundary.

16. The TFT of claim 13 wherein the first pair of sides is located between a first pair of consecutive grain boundaries; and,
    wherein the oxide gate insulator layer has a thickness in a range of 20 to 20 A over the channel region.

17. The TFT of claim 9 wherein the metal atoms are selected from the group including cobalt, copper, gold, iron, nickel, palladium, and platinum atoms.

18. The TFT of claim 9 wherein the isotropic poly-Si layer has approximately: 39 percent of grain boundaries less than 3°; 19 percent of grain boundaries in a range of 3° to 15°; and 4 percent of grain boundaries in a range of 15° to 24°.

19. A thin film transistor (TFT) with a channel region formed from high quality isotropic polycrystalline silicon (poly-Si), the TFT comprising:
    a transparent substrate;
    a diffusion barrier overlying the transparent substrate;
    overlying the diffusion barrier, a high quality isotropic poly-Si layer with:
        metal atoms in a concentration of less than 1 $e^{17}$ atoms/square centimeter;

high aspect cratio crystal domains separated by parallel grain boundaries configured in a first dimension and having widths in a range of 0.1 to 1 micron;
crystal defects spatially confined to the first dimension;
transistor source and drain regions; and,
a transistor channel region interposed between the source and drain regions;
an oxide gate insulator layer with a thickness in a range of 20 to 500 angstroms overlying the poly-Si layer; and,
a gate electrode overlying the oxide gate insulator layer.

20. The TFT of claim 19 wherein the metal atoms are selected from the group including cobalt, copper, gold, iron, nickel, palladium, and platinum atoms.

* * * * *